(12) United States Patent
Rogers et al.

(10) Patent No.: US 11,201,595 B2
(45) Date of Patent: Dec. 14, 2021

(54) CASCODE POWER AMPLIFIER WITH SWITCHABLE OUTPUT MATCHING NETWORK

(71) Applicant: SKYWORKS SOLUTIONS, INC., Woburn, MA (US)

(72) Inventors: John William Mitchell Rogers, Nepean (CA); Gordon Glen Rabjohn, Ottawa (CA); John Jackson Nisbet, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 15/360,491

(22) Filed: Nov. 23, 2016

(65) Prior Publication Data

US 2017/0149390 A1 May 25, 2017

Related U.S. Application Data

(60) Provisional application No. 62/259,310, filed on Nov. 24, 2015.

(51) Int. Cl.
| | |
|---|---|
| *H03F 1/32* | (2006.01) |
| *H03F 1/56* | (2006.01) |
| *H03F 1/22* | (2006.01) |
| *H03F 3/19* | (2006.01) |
| *H03F 3/24* | (2006.01) |
| *H03F 1/02* | (2006.01) |

(52) U.S. Cl.
CPC ............. *H03F 1/32* (2013.01); *H03F 1/0205* (2013.01); *H03F 1/22* (2013.01); *H03F 1/565* (2013.01); *H03F 3/19* (2013.01); *H03F 3/245* (2013.01); *H03F 2200/18* (2013.01); *H03F 2200/222* (2013.01); *H03F 2200/318* (2013.01); *H03F 2200/387* (2013.01); *H03F 2200/451* (2013.01)

(58) Field of Classification Search
CPC ..... H03F 1/32; H03F 1/22; H03F 1/19; H03F 1/565; H03F 3/19; H03F 3/245; H04B 1/40
USPC ........................................................ 455/73
See application file for complete search history.

(56) References Cited

U.S. PATENT DOCUMENTS

| | | | |
|---|---|---|---|
| 4,241,316 A | 12/1980 | Knapp | |
| 5,774,017 A * | 6/1998 | Adar | ..................... H03F 1/0261 330/126 |
| 5,974,041 A * | 10/1999 | Kornfeld | ............... H03F 1/0277 370/342 |
| 6,681,103 B1 | 1/2004 | Rogers et al. | |
| 7,202,736 B1 * | 4/2007 | Dow | ......................... H03F 1/14 330/129 |
| 7,417,508 B1 * | 8/2008 | Quaglietta | ................ H03F 1/56 330/124 R |

(Continued)

*Primary Examiner* — Jinsong Hu
*Assistant Examiner* — Rui M Hu
(74) *Attorney, Agent, or Firm* — Chang & Hale LLP

(57) ABSTRACT

A radio-frequency (RF) module includes a first transistor having a base, a collector, and an emitter, a radio-frequency output transmit path coupled to the collector of the first transistor at a first end and to a radio-frequency output port at a second end, and an output matching network disposed in the radio-frequency output transmit path, the output matching network including a shunt arm coupled to ground, the shunt arm including a switch that is controllable to modify an impedance of the output matching network.

13 Claims, 10 Drawing Sheets

(56) References Cited

U.S. PATENT DOCUMENTS

| | | | |
|---|---|---|---|
| 7,821,349 B2 | 10/2010 | Park et al. | |
| 8,294,514 B2* | 10/2012 | Visser | H03F 1/56 330/2 |
| 8,731,496 B2* | 5/2014 | Drogi | H03F 3/24 455/127.1 |
| 8,761,698 B2* | 6/2014 | Langer | H03F 1/3241 455/127.1 |
| 9,374,040 B2* | 6/2016 | Matsui | H03F 1/0222 |
| 9,712,158 B1* | 7/2017 | Cavus | H03K 17/063 |
| 9,806,675 B2* | 10/2017 | Yang | H03F 1/0216 |
| 9,985,588 B2 | 5/2018 | Rogers | |
| 10,164,669 B2 | 12/2018 | Cook et al. | |
| 10,284,149 B2 | 5/2019 | Rogers | |
| 10,320,336 B2 | 6/2019 | Rogers | |
| 10,432,241 B2 | 10/2019 | Cook et al. | |
| 2002/0053947 A1* | 5/2002 | Macedo | H03F 3/191 330/151 |
| 2002/0084855 A1 | 7/2002 | Kwon et al. | |
| 2002/0130720 A1 | 9/2002 | Pavio et al. | |
| 2002/0175764 A1* | 11/2002 | Matsuura | H03F 1/0227 330/302 |
| 2003/0016082 A1* | 1/2003 | Matsunaga | H03F 1/0261 330/133 |
| 2004/0008082 A1* | 1/2004 | Dow | H03F 3/191 330/51 |
| 2004/0121745 A1* | 6/2004 | Meek | H03H 7/383 455/129 |
| 2004/0195917 A1* | 10/2004 | Rofougaran | H03L 7/18 307/109 |
| 2005/0030094 A1* | 2/2005 | Conrad | H03F 1/0261 330/144 |
| 2005/0083117 A1* | 4/2005 | Kim | H03F 1/0211 330/51 |
| 2005/0110575 A1 | 5/2005 | Sivonen et al. | |
| 2005/0134359 A1* | 6/2005 | Lopez | G05F 3/205 327/434 |
| 2005/0179499 A1* | 8/2005 | Fenk | H03F 3/211 330/295 |
| 2005/0258896 A1* | 11/2005 | Bardsley | H03F 1/0277 330/51 |
| 2006/0001484 A1* | 1/2006 | Paul | H03F 1/0205 330/51 |
| 2006/0132232 A1* | 6/2006 | Baree | H03F 1/0261 330/51 |
| 2006/0158256 A1* | 7/2006 | Luo | H03F 3/189 330/296 |
| 2007/0111685 A1* | 5/2007 | Paul | H03F 3/72 455/127.3 |
| 2007/0184793 A1* | 8/2007 | Drogi | H03F 1/0227 455/127.1 |
| 2007/0296507 A1 | 12/2007 | Hamaguchi | |
| 2008/0012643 A1 | 1/2008 | Duperray | |
| 2008/0079499 A1* | 4/2008 | Tsai | H03F 3/193 330/311 |
| 2008/0169877 A1* | 7/2008 | Banba | H03F 1/565 330/306 |
| 2008/0186032 A1* | 8/2008 | Van Bezooijen | H03H 7/40 324/646 |
| 2008/0231368 A1* | 9/2008 | Suzaki | H03F 1/30 330/277 |
| 2008/0266021 A1* | 10/2008 | Van Bezooijen | H04B 1/0458 333/32 |
| 2009/0009250 A1 | 1/2009 | Satoh et al. | |
| 2009/0039960 A1* | 2/2009 | Park | H03F 1/32 330/278 |
| 2009/0085670 A1 | 4/2009 | Jeong et al. | |
| 2009/0096533 A1* | 4/2009 | Paul | H03F 1/56 330/305 |
| 2009/0318093 A1* | 12/2009 | Prikhodko | H03F 1/56 455/73 |
| 2010/0045384 A1* | 2/2010 | Fisher | H03F 3/19 330/288 |
| 2010/0321086 A1* | 12/2010 | See | H04B 1/0458 327/359 |
| 2011/0063035 A1 | 3/2011 | Park et al. | |
| 2011/0063042 A1* | 3/2011 | Mendolia | H03F 3/60 333/17.3 |
| 2011/0227666 A1* | 9/2011 | Manssen | H03H 7/40 333/32 |
| 2011/0260797 A1* | 10/2011 | Lee | H03F 3/211 330/295 |
| 2012/0032743 A1 | 2/2012 | Hsieh et al. | |
| 2012/0071120 A1* | 3/2012 | Pinarello | H03F 3/24 455/127.5 |
| 2012/0075016 A1* | 3/2012 | Visser | H04B 1/0458 330/116 |
| 2012/0126886 A1* | 5/2012 | Hellberg | H03F 3/602 330/51 |
| 2012/0249236 A1* | 10/2012 | Langer | H03F 1/0272 330/127 |
| 2012/0249259 A1* | 10/2012 | Keese | H03H 7/40 333/32 |
| 2012/0286873 A1* | 11/2012 | Li | H03G 3/3042 330/285 |
| 2013/0027129 A1* | 1/2013 | Langer | H03F 1/56 330/127 |
| 2013/0093511 A1* | 4/2013 | Baek | H03F 1/0277 330/124 R |
| 2013/0187828 A1* | 7/2013 | Desclos | H03H 7/38 343/861 |
| 2013/0190036 A1* | 7/2013 | Zhao | H03F 3/245 455/550.1 |
| 2013/0207731 A1* | 8/2013 | Balteanu | H03F 1/56 330/296 |
| 2013/0265111 A1* | 10/2013 | Ota | H03F 3/245 330/286 |
| 2013/0314164 A1 | 11/2013 | Din et al. | |
| 2014/0103996 A1* | 4/2014 | Horiguchi | H04B 1/0458 330/127 |
| 2014/0125410 A1* | 5/2014 | Pamarti | H03F 1/565 330/149 |
| 2014/0184334 A1* | 7/2014 | Nobbe | H03F 3/21 330/291 |
| 2014/0203871 A1* | 7/2014 | Pamarti | H03F 3/245 330/251 |
| 2014/0220910 A1* | 8/2014 | Jia | H03G 3/3042 455/78 |
| 2014/0227981 A1* | 8/2014 | Pecen | H01Q 1/52 455/77 |
| 2014/0266423 A1* | 9/2014 | Drogi | H03F 1/0227 330/75 |
| 2014/0266460 A1* | 9/2014 | Nobbe | H03F 1/223 330/295 |
| 2014/0266461 A1 | 9/2014 | Youssef et al. | |
| 2014/0361837 A1* | 12/2014 | Strange | H03F 1/0238 330/297 |
| 2014/0375390 A1* | 12/2014 | Schooley | H03F 3/191 330/296 |
| 2015/0061770 A1* | 3/2015 | Luo | H03F 3/193 330/288 |
| 2015/0091656 A1* | 4/2015 | Gaynor | H03F 1/565 330/302 |
| 2015/0145604 A1* | 5/2015 | Scott | H03F 3/24 330/296 |
| 2015/0207531 A1 | 7/2015 | Vahid Far et al. | |
| 2015/0222234 A1* | 8/2015 | Tabei | H03F 1/0211 330/261 |
| 2015/0270813 A1* | 9/2015 | Morshedi | H04B 17/19 455/144 |
| 2015/0280672 A1* | 10/2015 | Ding | H03F 3/19 375/345 |
| 2015/0311874 A1* | 10/2015 | Samelis | H04B 1/44 455/95 |
| 2015/0326255 A1* | 11/2015 | Dally | H03F 3/2175 375/297 |
| 2016/0036392 A1 | 2/2016 | Bohsali et al. | |
| 2016/0050629 A1* | 2/2016 | Khesbak | H03F 3/245 455/574 |

(56) References Cited

U.S. PATENT DOCUMENTS

| | | | |
|---|---|---|---|
| 2016/0072444 A1* | 3/2016 | Gorbachov | H03F 1/0261 |
| | | | 330/256 |
| 2016/0094190 A1* | 3/2016 | Young | H03F 3/19 |
| | | | 330/250 |
| 2016/0134245 A1* | 5/2016 | Won | H03K 17/60 |
| | | | 330/296 |
| 2016/0248387 A1* | 8/2016 | Kim | H03F 3/19 |
| 2016/0285482 A1* | 9/2016 | Wada | H03H 7/463 |
| 2017/0012585 A1* | 1/2017 | Sarbishaei | H03F 3/21 |
| 2017/0012653 A1* | 1/2017 | Fong | H03F 3/213 |
| 2017/0195972 A1* | 7/2017 | Drogi | H03F 1/565 |
| 2017/0352947 A1* | 12/2017 | Solomko | H01Q 1/248 |
| 2018/0076779 A1* | 3/2018 | Wang | H03F 1/56 |
| 2019/0273470 A1 | 9/2019 | Rogers | |

\* cited by examiner

CASCODE POWER AMPLIFIER WITH SWITCHABLE OUTPUT MATCHING NETWORK

CROSS-REFERENCE TO RELATED APPLICATION(S)

This application claims priority to U.S. Provisional Application No. 62/259,310, filed Nov. 24, 2015, and entitled CASCODE POWER AMPLIFIER WITH SWITCHABLE OUTPUT MATCHING NETWORK, the disclosure of which is hereby incorporated by reference in its entirety.

BACKGROUND

Field

The present disclosure relates to radio-frequency signal processing.

Description of the Related Art

Amplifier devices can be used in processing radio-frequency signals. Certain amplifier devices can suffer from undesirable distortion, which may affect system performance.

SUMMARY

In accordance with some implementations, the present disclosure relates to a radio-frequency module comprising a first transistor having a base, a collector, and an emitter, a radio-frequency output transmit path coupled to the collector of the first transistor at a first end and to a radio-frequency output port at a second end, and an output matching network disposed in the radio-frequency output transmit path, the output matching network including a shunt arm coupled to ground, the shunt arm including a switch that is controllable to modify an impedance of the output matching network. The output matching network may be configured to present a first impedance when the switch is set in an OFF state for a high-power mode and present a second impedance when the switch is set in an ON state for a low-power mode, the second impedance being greater than the first impedance.

In certain embodiments, the shunt arm includes a capacitor connected in series with the switch. Furthermore, the output matching network may include an inductor coupled between the shunt arm and the collector of the first transistor.

In certain embodiments, the radio-frequency module further comprises a second transistor having a base, a collector, and an emitter, wherein the collector of the second transistor is coupled to the emitter of the first transistor in a cascode configuration. The radio-frequency module may further comprise bias boost circuitry coupled to the base of the second transistor, the bias boost circuitry including a third transistor having an emitter coupled to the base of the second transistor via a switchable resistance. The switchable resistance may include a first resistor, a second resistor, and a field-effect transistor coupled to first and second ends of the first resistor. In certain embodiments, the radio-frequency module comprises an AM-PM distortion correcting capacitor coupled between the base and emitter of the first transistor.

In some implementations, the present disclosure relates to a power amplifier circuit comprising a first transistor having a base, a collector, and an emitter, a radio-frequency output transmit path coupled to the collector of the first transistor at a first end and to a radio-frequency output port at a second end, and an output matching network disposed in the radio-frequency output transmit path, the output matching network including a shunt arm coupled to ground, the shunt arm including a switch that is controllable to modify an impedance of the output matching network. The output matching network may be configured to present a first impedance when the switch is set in an OFF state for a high-power mode and present a second impedance when the switch is set in an ON state for a low-power mode, the second impedance being greater than the first impedance.

In certain embodiments, the shunt arm includes a capacitor connected in series with the switch. In addition, the output matching network may include an inductor coupled between the shunt arm and the collector of the first transistor.

The power amplifier circuit may further comprise a second transistor having a base, a collector, and an emitter, the collector of the second transistor being coupled to the emitter of the first transistor in a cascode configuration. In certain embodiments, the power amplifier circuit further comprises bias boost circuitry coupled to the base of the second transistor, the bias boost circuitry including a third transistor having an emitter coupled to the base of the second transistor via a switchable resistance. For example, the switchable resistance may include a first resistor, a second resistor, and a transistor switch coupled to first and second ends of the first resistor. In certain embodiments, the power amplifier circuit comprises a capacitor coupled between the base and emitter of the first transistor.

In some implementations, the present disclosure relates to a wireless device comprising an antenna, a transceiver configured to generate a radio-frequency input signal, a radio-frequency module configured to receive the radio-frequency input signal and provide a radio-frequency output signal to the antenna, a power amplifier module associated with the radio-frequency module and configured to receive the radio-frequency input signal and amplify the radio-frequency input signal to generate the radio-frequency output signal, and a power amplifier output matching module coupled to the power amplifier module, the power amplifier output matching module including a shunt arm coupled to ground, the shunt arm including a switch that is controllable to modify an impedance of the output matching network.

In certain embodiments, the power amplifier output matching module is configured to present a first impedance when the switch is set in an OFF state for a high-power mode and present a second impedance when the switch is set in an ON state for a low-power mode, the second impedance being greater than the first impedance. The shunt arm may include a capacitor connected in series with the switch. The power amplifier output matching module may include an inductor coupled between the shunt arm and the collector of the first transistor.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DESCRIPTION

The headings provided herein are for convenience only and do not necessarily affect the scope or meaning of the claimed invention.

In certain implementations, the present disclosure relates to systems, devices and methods utilizing power amplifier (PA) modules. In radio frequency (RF) communication circuits, relatively high-power amplifiers may be used to increase the strength of a transmitted signal. Various power amplifier designs and topologies are disclosed herein, including cascode PAs, such as 5 GHz cascode PA designs.

Increasing demand for wireless communication devices, as well as the demand for increasing through-put in such devices, has led to the development of more and more sophisticated modulation schemes requiring increasingly strict RF performance parameters. While many wireless processing components comprise circuitry utilizing complementary metal-oxide-semiconductor (CMOS) technology, including field effect transistors (FETs; e.g., metal oxide field effect transistors (MOSFETs)), certain RF components may implement power amplifier(s) comprising bipolar junction transistors (BJTs), such as RF power amplifiers (PAs) and/or low-noise amplifiers (LNAs), which may be implemented in front end modules (FEMs), for example. RF power amplifiers often operate near saturation levels, and can suffer from various nonlinear effects that can degrade performance. The nonlinear effects of an amplifier at a specified frequency may be quantified by the AM-AM and AM-PM distortion; that is, the amplitude and phase modulations or distortions as functions of the amplitude of the input signal.

Disclosed herein are certain power amplifier topologies and designs, which may be implemented in, for example, 5 GHz-band WiLAN applications. For example, casecode power amplifier topologies are described herein, which may provide an alternative to standard common-emitter (CE) power amplifier topologies. Cascode power amplifiers may offer relatively high gain, which may allow for designs having relatively few amplifier stages and/or improved dynamic error vector magnitude (EVM) due to relatively low power consumption in the gain controlling device.

Figure 1:
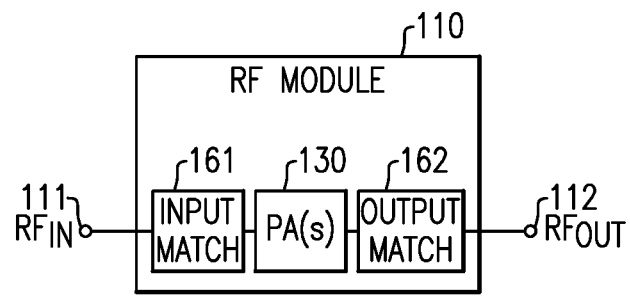
FIG. 1 is a block diagram illustrating a radio frequency (RF) module according to one or more embodiments.

FIG. 1 shows that, in some embodiments, a radio frequency (RF) module 110 can include one or more power amplifiers 130. The power amplifier(s) 130 may be connected between an RF input terminal 111 of the RF module 110 and an RF output terminal 112. In certain implementations, one or more of the power amplifier(s) 130 comprises a cascode power amplifier including at least two transistors, a driver transistor and a cascode transistor, wherein a collector of the driver transistor is coupled to an emitter of the cascode transistor. In addition, the power amplifier module 130 may comprise multiple amplifier stages, such as multiple cascode amplifier stages. The power amplifier(s) 130 may be powered by a supply voltage (e.g., 5 V supply) via a supply terminal (not shown).

The RF signal to be amplified may be received by the RF module 110 and provided to the power amplifier(s) 130 via an input impedance matching component 161, wherein the amplified version of the RF signal is provided to an output terminal 112 of the RF module 110 via an output impedance matching component 162. Thus, the input impedance matching component 161 is disposed between the RF input terminal 111 and the power amplifier input terminals and the output impedance matching component is disposed between the power amplifier output terminals and the RF output terminal 112. The input matching component 161 may be configured to match, for example, 50 ohms, to an impedance value that it may be desirable for the power amplifier module 130 to see. The output matching component 162 may be configured to adjust the low line of the power amplifier module 130.

Although certain embodiments are disclosed herein in the context of multi-stage (e.g., including a driver stage and an output stage) cascode power amplifiers, it should be understood that the various power amplifiers and power amplifier modules disclosed herein may include different types of power amplifiers, such as one or more single-transistor amplifiers, one or more single-stage amplifiers, one or more Doherty amplifiers, or other types of power amplifiers.

Figure 2:
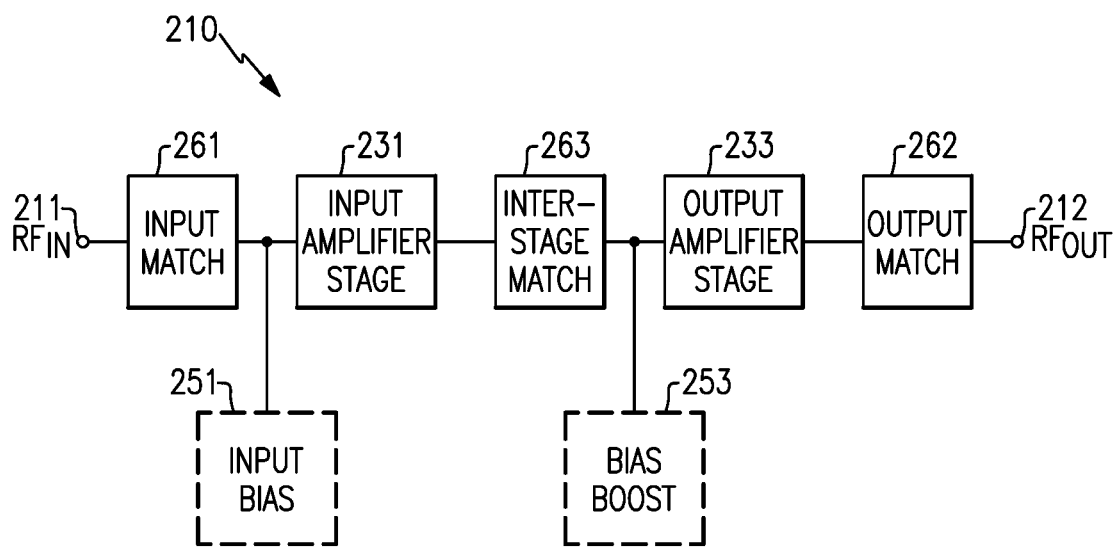
FIG. 2 is a block diagram illustrating RF circuitry 210 providing RF amplification according to one or more embodiments.

FIG. 2 is a block diagram illustrating radio-frequency (RF) circuitry 210 providing RF amplification according to one or more embodiments. The RF circuitry 210 includes input matching circuitry 261, which may be similar in certain respects to the input matching module 161 shown in FIG. 1 and described above.

The RF circuitry 210 may include a port or transmission channel 211 for receiving an RF input signal, such as from a transceiver or other system component, and may further include input matching circuitry 261, as described above. In certain embodiments, the RF circuitry 210 includes input bias circuitry 231, which may serve to bias the current injected into a driver transistor of an input amplifier stage 231 (e.g., driver stage). The input amplifier stage 231 may comprise a cascode amplifier, as described herein, or may comprise a common-emitter or other type of amplifier.

The RF circuitry may further include inter-stage matching circuitry 263 disposed between the input amplifier stage 231 and a second (e.g., output) amplifier stage. Bias circuitry 253 may further be connected between the amplifier stages 231, 233. For example, the bias circuitry 253 (i.e., "bias boost") may be connected in parallel with the signal transmission path. The bias boost 253 may provide gain-compensation circuitry for the output amplifier stage 233. In certain embodiments, the bias boost 253 comprises a power detector configured to adjust the current provided to a driver transistor of the output amplifier stage 233. In certain embodiments, the bias boost 253 may be configured to provide two or more discrete gain factor values for controlling the gain of the amplifier 233.

The output amplifier stage may comprise a cascode power amplifier, or other type of amplifier. The RF signal output of the output amplifier stage 233 may be provided to output matching circuitry 262. The output matching circuitry may be configured to provide a load line designed to provide efficiency at a transmit power level at which the circuit 210 is intended to operate. In certain embodiments, the output matching circuitry may be dynamically configurable to provide two or more discrete impedance values, which may be desirable to provide optimized load line impedance for a plurality of power levels, such as low- and high-power operational levels. The amplifier output matching circuit 262 may be controllable by a control line (not shown) that adjusts the impedance between a lower impedance and a higher impedance. Although certain embodiments are disclosed herein in the context of two-mode output matching impedance, it should be understood that adjustable matching networks as disclosed herein may have any number of modes.

Figure 3:
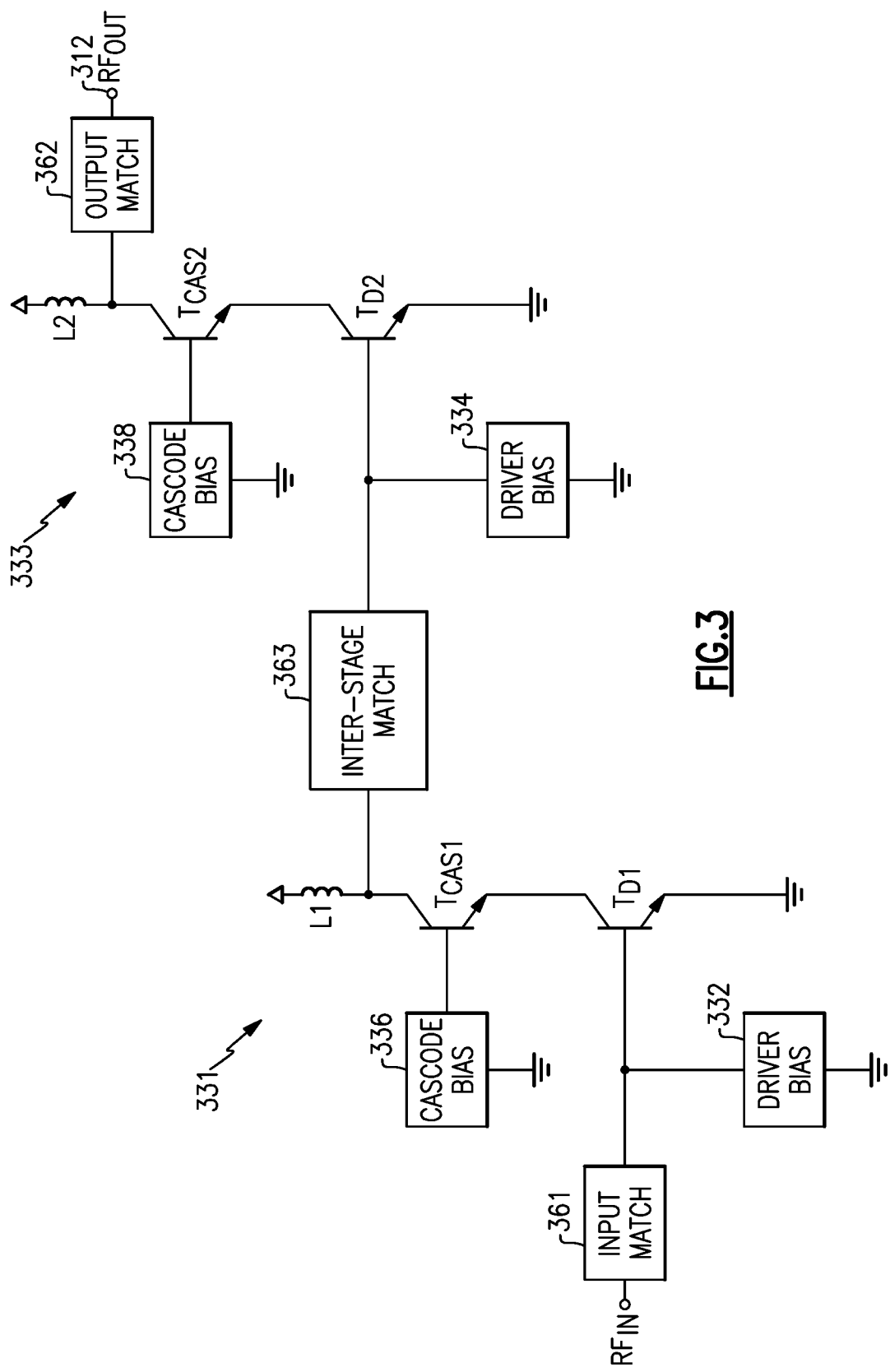
FIG. 3 is a circuit diagram illustrating a multi-stage cascode power amplifier according to one or more embodiments.

FIG. 3 is a circuit diagram illustrating a multi-stage cascode power amplifier 361 according to one or more embodiments disclosed herein. The power amplifier circuit may comprise two (or more) gain stages (331, 333), wherein the first stage is formed with the illustrated driver transistor $T_{D1}$ and cascode amplifier $T_{CAS1}$, and the second stage is formed with the driver transistor $T_{D2}$ and cascode transistor $T_{CAS2}$.

The circuit of FIG. 3 may include driver bias circuitry (e.g., 332, 334) coupled to the base of the driver transistor of one or more of the amplifier stages 331, 333. The driver bias circuit(s) (332, 334) may include power detection circuitry, which may set the current through the amplifier transistor(s) in the associated amplifier stage, such as through the use of a current mirror. In certain embodiments, a resistor (not shown) may be placed in series with the driver bias circuitry (332, 334) to provide increased control over the gain curve. In certain embodiments, the resistance coupling the driver bias to the driver transistor is adjustable using a switch or the like. For example, a first resistance may be utilized when the output power is high, while a second resistance may be utilized when the output power is low.

It may be desirable for the base of the cascode transistor(s) ($T_{CAS1}$, $T_{CAS2}$) to be substantially free of RF signal, such that a substantially fixed DC voltage is present at the base of the device. In certain embodiments, one or more of the amplifier stages 331, 333 may include cascode biasing circuitry (336, 338), such as a DC voltage source, or the like, connected between the base of the cascode transistor and ground to provide DC voltage to the base of the cascode transistor. In certain embodiments, a capacitor (not shown), or some type of capacitance, may be connected between the base and emitter (or collector) of the cascode transistor of one or more of the amplifier stages of the circuit of FIG. 3. For example, in cascode transistor topologies, the cascode transistor (e.g., $T_{CAS1}$, $T_{CAS2}$) may be subject to AM-PM distortion due to voltage swing volatility. Therefore, in certain embodiments, a linearizing capacitor (not shown) may be placed in parallel with the base-emitter capacitance of the cascode transistor of one or more stages of the power amplifier circuit 361. Such capacitor placement may allow for modification of the shape of the AM-PM curve by selecting an optimized size for the capacitor.

The amplifier circuit of FIG. 3 further includes output matching circuitry 362 that may provide an adjustable load line, which may improve efficiency of the amplifier in backed-off power conditions, for example. Although the adjustable load line concept is disclosed herein in connection with multi-stage cascode power amplifiers, it should be understood that such concepts may be applicable in other types of amplifiers as well.

Figure 4:
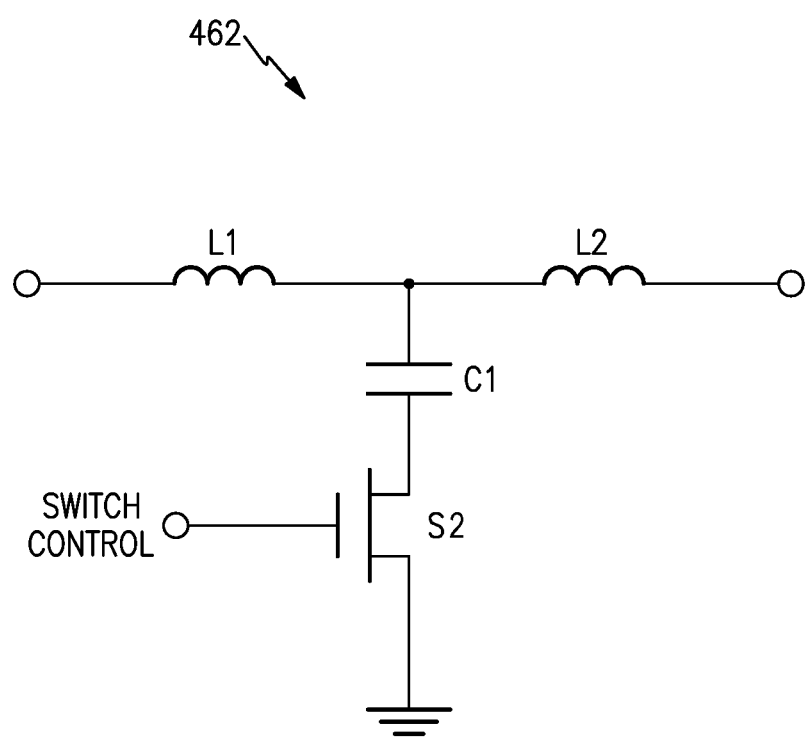
FIG. 4 is a circuit diagram illustrating an adjustable impedance output matching circuit for a power amplifier according to one or more embodiments.

FIG. 4 is a circuit diagram illustrating an embodiment of an adjustable impedance output matching circuit 462 for a power amplifier according to one or more embodiments disclosed herein. For example, the output matching circuit 362 shown in FIG. 3 and described above may be similar in certain respects to the circuit 462 shown in FIG. 4. In certain embodiments, it may be desirable for a relatively small resistance to be present at the collector of the cascode transistor of a cascode power amplifier (or driver transistor of a common-emitter power amplifier) for relatively high-power applications. However, as power is backed-off, relatively larger resistance may be desirable; with a constant load resistance, as power is backed-off, efficiency may be lost. Therefore, in order to provide flexibility in output impedance, the output matching circuit 462 may include a mechanism for adjusting the impedance of the circuit. For example, an output matching circuit 462 according to the present disclosure may include one or more switches $S_2$, which, in combination with a capacitor $C_1$ (or other passive element), may provide a relatively low impedance (e.g., about 9-10 ohms) with the switch $S_2$ in an OFF state for relatively high-power states, or alternatively a relatively high impedance (e.g., about 30-35 ohms) with the switch $S_2$ in an ON state for relatively low-power states. In certain embodiments, operation of the switch $S_2$ may provide desirable efficiency for a power level that is as low as ¼ the power of the maximum transmit level, or lower.

The output matching circuit 462 may include one or more inductors (L1, L2), as well as the shunt capacitor $C_1$. The shunt capacitance may be seen at the load when the switch $S_2$ is closed, thereby providing an impedance transformation down to a lower value; when the switch is open, the capacitance may be effectively removed, causing the impedance to remain at a relatively high level across the inductance.

Figure 5:
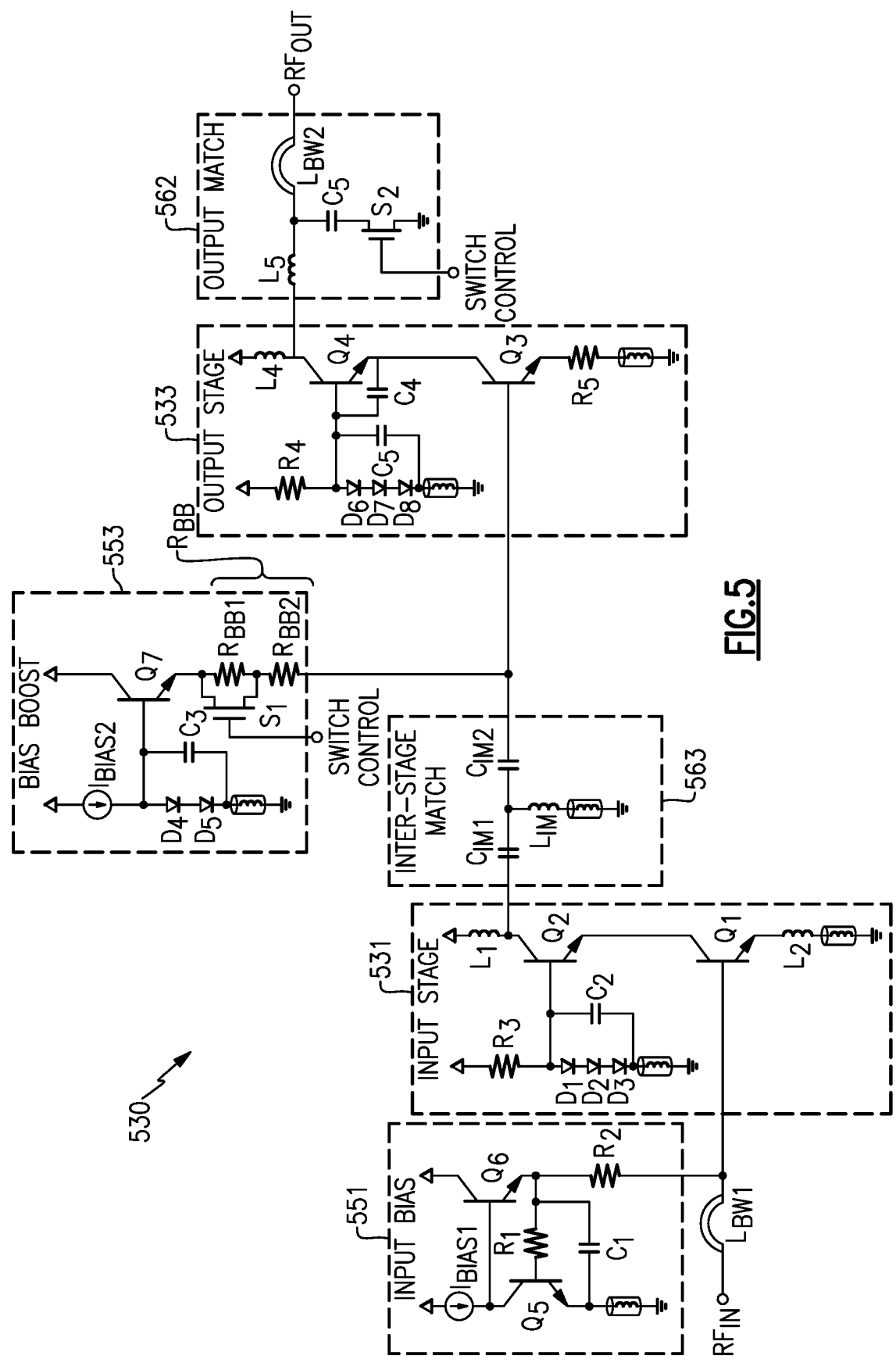
FIG. 5 is a circuit diagram illustrating a multi-stage cascode power amplifier circuit according to one or more embodiments.

FIG. 5 is a circuit diagram illustrating a multi-stage cascode power amplifier circuit 530 according to one or more embodiments. In one embodiment, the amplifier circuit 530 may represent a 5-6 GHz cascode power amplifier design, which may be implemented in a BiCMOS process, for example. In certain embodiments, all or a portion of the illustrated components may be formed and/or mounted in a single chip or die. In an embodiment, an RF input signal is transmitted to the circuit 530 over a metal connector that is connected between the chip associated with the circuit 530 and a printed circuit board (PCB). Such connector may provide an inductance $L_{BW1}$, which may be used as part of a matching component for the input of the amplifier circuit

530. In certain alternative embodiments, matching inductance is provided by one or more discrete inductors and/or other passive devices or elements. The inductance of the wire connector $L_{BW1}$ may be approximately 500 pF, or some other value. The input matching may further be accomplished (e.g., for 5-6 GHz) using an emitter inductor $L_2$ in combination with the input bond wire LBW1 to form a two-element broad-band matching network to match the circuit to an input impedance (e.g., 50 ohms) across a target bandwidth (e.g., 1 GHz bandwidth). In certain embodiments, the emitter inductor $L_2$ may be sized according to the following equation (1):

$$L_2 = \frac{R_s C_{\pi 1}}{g_{m1}} \quad (1)$$

where $R_s$ is the desired matching impedance (e.g., 50 ohms). Therefore, the bondwire $L_{BW1}$ may advantageously have an inductance of:

$$L_{BW1} = \frac{1}{C_{\pi 1} \omega} - \frac{R_s C_{\pi 1}}{g_{m1}} \quad (2)$$

where $\omega$ is the desired frequency of operation.

The circuit 530 includes input bias circuitry 551, which receives input power from the RF input signal and outputs a current level into the base of the driver transistor Q1. In order to prevent the bias circuitry 551 from increasing the current to the amplifier by too great an amount, the circuitry 551 includes a resistor R2 configured to control the amount of input power that is seen by the bias circuit 551. In certain embodiments, R2 provides an RF choke to at least partially isolate the bias circuit 551 from the RF signal. Because the resistor R2 may at least partially control the amount of gain expansion in the circuit, it may be desirable for the value of R2 to be chosen such that the gain of the amplifier remains substantially flat over an operational range of the amplifier. With a relatively large resistor value, a relatively constant current may flow into the amplifier; as the signal power increases, the transistor Q1 may at least partially compress, causing the gain to drop. With a relatively small resistor value, as the power level increases, causing the transistor Q1 to compress and become nonlinear, a higher current level may be injected into the base of the transistor Q1 to effectively offset the nonlinearity caused by increased power.

The input stage 531 of the circuit 530 may include DC bias circuitry coupled to the base of the cascode transistor Q2. As a nonlinear device, the base-to-emitter voltage of the transistor Q2 may be sensitive to the signal power level present at the base due to, for example, second-order distortion. Therefore, in certain embodiments, the base of each cascode transistor of the circuit (e.g., Q2, Q4) may be AC-grounded through a relatively large capacitor, which may advantageously be connected as closely as possible to the base of the transistor. However, in certain embodiments, even relatively large capacitor values (e.g., 15 pF for C2 and/or 25 pF for C5) may not provide sufficient grounding at the base of the transistor(s). When the voltage swings become large, such node(s) may experience changes in the bias level. In order to reduce this effect, diodes may be utilized to provide a relatively constant bias voltage to the bases of the cascode transistors. In the illustrated circuit 530, three diodes are used (D1, D2 and D3 for transistor Q2; and D6, D7 and D8 for transistor Q4) to provide a bias voltage of, for example, about 2.4 V to the base of the casecode transistor(s). Such a configuration may result in a VCE of approximately 1.5 V for both transistor Q1 and transistor Q3, which may keep them out of saturation and also provide sufficient head room for the transistor Q2 and the transistor Q4.

The input stage 531 of the power amplifier 530 may be designed as a class-A amplifier with a peak voltage swing not to exceed 3 V, for example. An RF choke inductor $L_1$ may provide bias to the input stage 531. The load line and current for the input stage 531 may be designed to allow for the amplifier to remain linear and allow the design performance to be substantially limited by the output stage 533.

Figure 6:
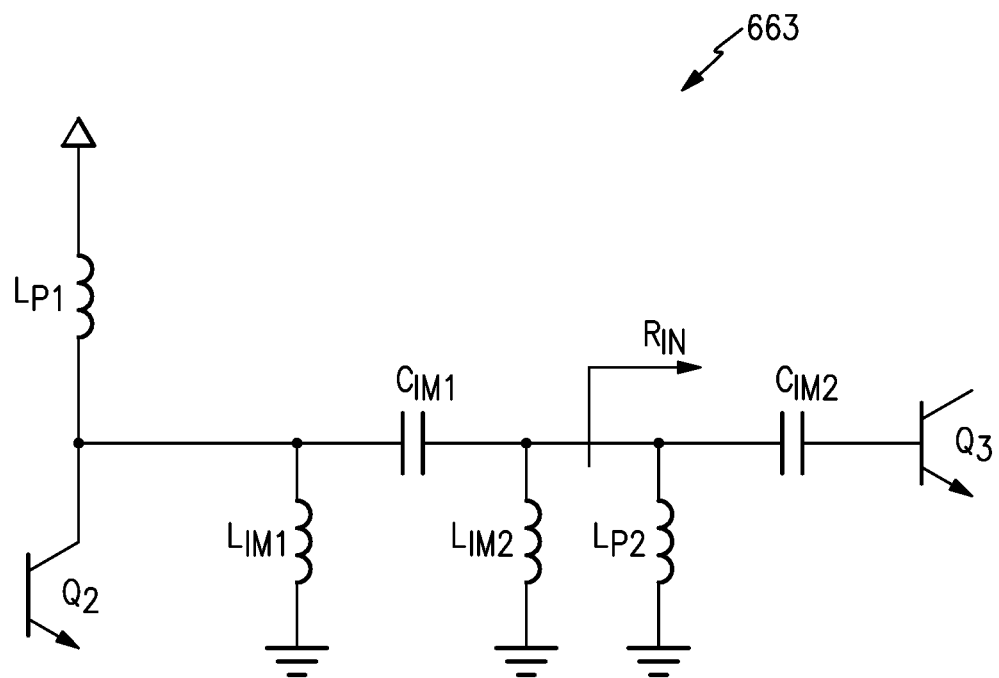
FIG. 6 is a circuit diagram illustrating inter-stage matching circuitry according to one or more embodiments.

The circuit 530 includes inter-stage matching circuitry 563 configured to connect the two active amplifier stages. A conceptual representation of the inter-stage matching circuitry 563 is shown in FIG. 6. As shown in FIG. 6, $L_{P2}$ and $C_{IM2}$ may form a conventional LC matching network to transform the input impedance of $Q_3$ into a real impedance. In certain embodiments, a relatively low impedance may be used to broaden the bandwidth of the match. In addition, $L_{IM}$ and $C_{IM1}$ (see FIG. 5) may form a lumped-element left-handed transmission line. The various elements of the inter-stage matching circuitry 563 may be sized so that the electrical length of the transmission line is approximately a quarter wavelength with respect to the fundamental frequency of the transmission signal. Thus, the input impedance of the output stage 533 may advantageously be transformed into a desired load line that is optimal for the input stage 531. For example, the components may be sized as follows:

$$L_{IM1} = L_{IM2} = \frac{Z_0}{2\pi f_c} \quad (3)$$

$$C_{IM1} = \frac{1}{2\pi Z_o f_c} \quad (4)$$

where $Z_o$ represents the impedance of the transmission line, which may be sized such that:

$$Z_o = \sqrt{R_{in\_OS} R_{LL\_IS}} \quad (5);$$

where $R_{LL\_IS}$ is the desired load line impedance for the first stage, and $R_{in\_OS}$ is the input impedance for the output stage 533.

The circuit 530 may include bias boost circuitry 553 connected in parallel to the transmission path at the base of the driver transistor $Q_3$ of the output stage. The use of a bias boosting cell may help to flatten the power added efficiency (PAE) curve of the circuit 530. In a bipolar transistor with resistive degeneration, the output current may be represented by the following power series:

$$i_{c4} = \frac{v_s}{R_{EB} + r_{e3}} + \frac{1}{2I_{C4}} \left(\frac{r_{e3}}{R_{EB} + r_{e3}}\right) \quad (6)$$
$$\left(\frac{v_s}{R_{EB} + r_{e3}}\right)^2 + \left[\frac{1}{2I_{C4}^2}\left(\frac{r_{e3}}{R_{EB} + r_{e3}}\right)^2 - \frac{1}{3I_{C4}^2}\left(\frac{r_{e3}}{R_{EB} + r_{e3}}\right)\right]$$
$$\left(\frac{v_s}{R_{EB} + r_{e3}}\right)^3$$

As apparent in equation (6), the third-order term of the output current power series may become negative even with a small amount of degeneration $R_{EB}$. Thus, the gain may compress at relatively high input amplitudes. Such compression may set in prior to compression at the output due to relatively large voltage swings, which may cause the transistor to enter the saturation region. With one tone applied to the system, the input voltage $v_s$ to output collector current gain may be provided by:

$$\frac{i_c}{v_s} = k_1 + \frac{3}{4}k_3 v_s^2 \quad (7)$$

which can be expanded with the use of equation (6) to give:

$$\frac{i_c}{v_s} = \frac{1}{R_E + r_e} + \frac{3}{24 I_C^2}\left[3\left(\frac{r_e}{R_E + r_e}\right)^2 - 2\left(\frac{r_e}{R_E + r_e}\right)\right]\left(\frac{1}{R_E + r_e}\right)^3 v_s^2 \quad (8)$$

At low input levels, the gain may be relatively flat; however, as the input level rises, if the collector current remains substantially constant, the gain may fall off causing the amplifier to compress. In order to compensate for such effects, the bias boosting cell 553 may be designed to make $I_{C4}$ proportional to $v_s$ as well. With proper design/control, the gain curve may thereby be at least partially flattened. In order to achieve such gain linearity, the combination of the resistor(s) $R_{BB}$ and the transistor $Q_7$ may be implemented as a power detector. The power detection circuitry may be driven with $v_s$, and thus the current drawn by this branch of the circuit may be given by:

$$v_s = R_{BB} i_{c7} + v_T \left[\frac{i_{c7}}{I_{C7}} - \frac{1}{2}\left(\frac{i_{c7}}{I_{C7}}\right)^2 + \frac{1}{3}\left(\frac{i_{c7}}{I_{C7}}\right)^3\right] \quad (9)$$

It should be noted that the second-order term of equation (9) may generate a DC voltage shift in $V_{BE}$ for $Q_7$ ($V_{BE7}$) such that:

$$\Delta V_{BE7} = \frac{k_2}{2} i_{c7}^2 = -\frac{v_T}{4 I_{c7}^2} i_{c7}^2 \quad (10)$$

The reduction in $V_{BE7}$ may cause $V_{BE}$ for Q3 ($V_{BE3}$) to rise by a fraction of this change controlled by the resistance $R_{BB}$:

$$\Delta V_{BE3} = \Delta V_{BE7}\left[\frac{r_{\pi 3}}{r_{\pi 3} + R_{BB}}\right] \quad (11)$$

Thus, as $v_s$ increases, causing the gain to compress, $I_{C4}$ may also increase, causing the gain to expand. These two effects may be designed to effectively cancel each other out. The resistance $R_{BB}$ may act to control how fast the input level increases the current in the main transistor $Q_3$. The optimum value for $R_{BB}$ may be different for different load lines, and therefore certain embodiments disclosed herein advantageously provide for switchable resistance. In certain embodiments, by activating a switch (e.g., $S_1$, controlled by a switch control signal), the value of the resistance $R_{BB}$ may be optimized for two different power levels, such as a low-power mode and a high-power mode.

In one embodiment, the second stage, or output stage, 533 of the power amplifier 530 may be designed to have a 1 dB compression point of at least, for example, 26 dBm. Such a design may allow for linear operation for an average transmit power of, for example, 19 dBm. Within the output stage 533, the transistor device $Q_3$ may be a relatively high performance BJT, while the transistor device $Q_4$ may be a relatively high power BJT designed to handle relatively large output swings and collector voltages. Both devices may be sized such that, at a power level of approximately 26 dBm, the average current flow may provide a bias close to peak $f_T$. In an embodiment, such a design may result in an emitter area of approximately 1600 μm² for one or more of the transistors $Q_3$, $Q_4$. It should be noted that a cascode design, which may have a relatively lower output swing compared to a common-emitter power amplifier, may provide a relatively smaller optimum load resistance, which may lead to relatively higher average current and/or larger device area; a cascode design may therefore require more than twice the transistor area of a typical common-emitter design for the same power level.

It may be desirable for the load line may be chosen conservatively to avoid the cascode transistor $Q_4$ entering a saturation state, which may cause undesirable power-dependent phase shift through the device. In addition, a capacitor $C_4$ may be added to place a linear capacitance in parallel with $C_{\pi 4}$ to further linearize the phase shift through the device to a higher power level. For example, the cascode transistor $Q_4$ may cause AM-PM distortion to a greater extent than the driver transistor $Q_3$ in certain embodiments in view of such voltage swings; the driver transistor $Q_3$ may see a relatively smaller voltage swing, and may therefore be more linear. Therefore, the circuit 530 includes an AM-PM distortion compensating capacitor $C_4$ between the emitter of the cascode transistor $Q_4$ and its base.

DC bias circuitry including one or more resistors (e.g., R4), diodes (e.g., diodes $D_6$, $D_7$, $D_8$), and/or capacitors (e.g., $C_5$) may be connected in parallel at the base of the cascode transistor $Q_4$. The bias circuitry may provide a DC voltage to the base of the cascode transistor $Q_4$. The capacitor $C_5$ may serve to provide a ground reference at the base of the transistor $Q_4$ with respect to RF signals, resulting in a substantially fixed DC value at the base of the transistor $Q_4$.

According to certain embodiments, the values of $C_4$, $R_2$ and/or $R_{BB}$ may be selected to provide optimal AM-PM performance. Selection of values for such devices may be based on simulation. For example, because the transistors of the circuit may handle relatively large signals, they may generally operate in a relatively nonlinear manner, and therefore simulation may be a desirable means for identifying the desired resistor and/or capacitor values.

The output matching network 562 may incorporate an LCL network to transform, for example, a 50 ohm load to the optimal load impedance (e.g., for 26 dBm at 5 V). In order to increase the efficiency when the power amplifier is operating at a lower output power, the load line may be switched using a switch $S_2$, such as an NFET device. The switched resistance may provide approximately four times the load resistance in certain embodiments, and thus increase efficiency of the design while possibly reducing the output power to, for example, 20 dBm or lower.

The illustrated switchable load line technique based on control of the switch $S_2$ may provide increased power-added efficiency when the power amplifier is delivering lower output power. In one example implementation, the circuit design of FIG. 5 may implement a 5 V power supply to achieve a peak PAE of approximately 29%, and a 1 dB compression point of approximately 26.5 dBm. Therefore, the power amplifier circuit 530 may be matched to the load with the use of a switchable output matching network. The switchable output matching network may comprise one or more inductors, or inductive elements. For example, an inductance $L_{BW2}$ may be provided by an inductor formed with a bond wire in certain embodiments.

Figure 7A:
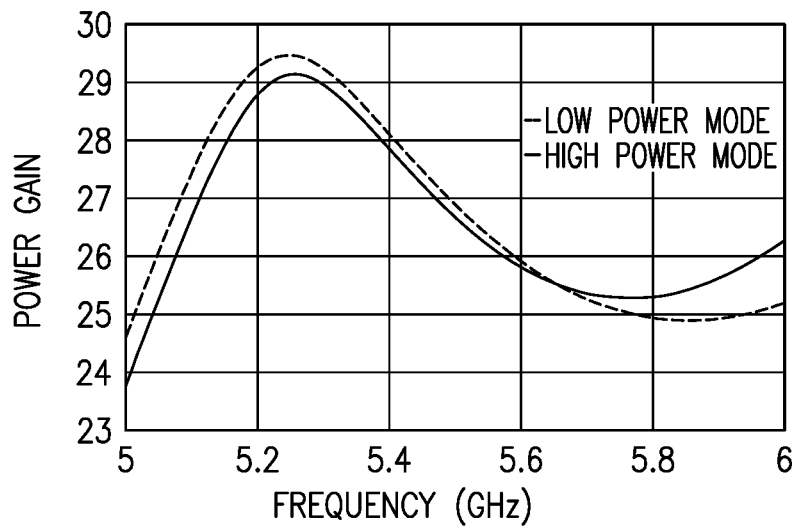
FIG. 7A is a graph representing example small-signal gain of a power amplifier implementing switchable output matching impedance in accordance with one or more embodiments.

FIG. 7A is a graph representing example small-signal gain of a power amplifier implementing switchable output matching impedance in accordance with one or more embodiments disclosed herein. The small-signal gain of a circuit is shown in FIG. 7A for both a low-power mode and a high-power mode of the associated power amplifier circuit. As shown, in certain embodiments, the bias current for the power amplifier may be at least partially reduced in the low-power mode, and may result in roughly equalized gain.

Figure 7B:
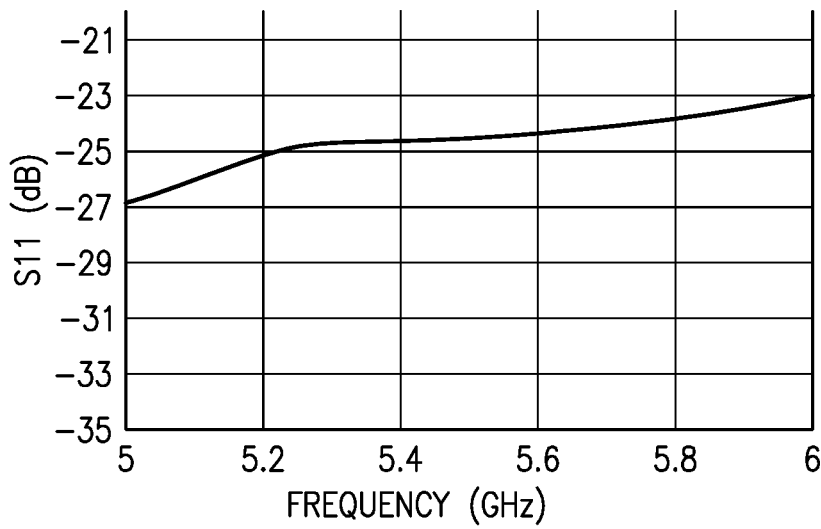
FIG. 7B is a graph representing small-signal input matching for a power amplifier implementing switchable output matching in accordance with one or more embodiments.

FIG. 7B is a graph representing small-signal input matching for a power amplifier implementing switchable output matching in accordance with one or more embodiments disclosed herein. FIG. 7B shows that, in certain embodiments, a power amplifier having switchable output matching may be designed such that it is substantially well matched across the entire 5-6 GHz band.

Figure 7C:
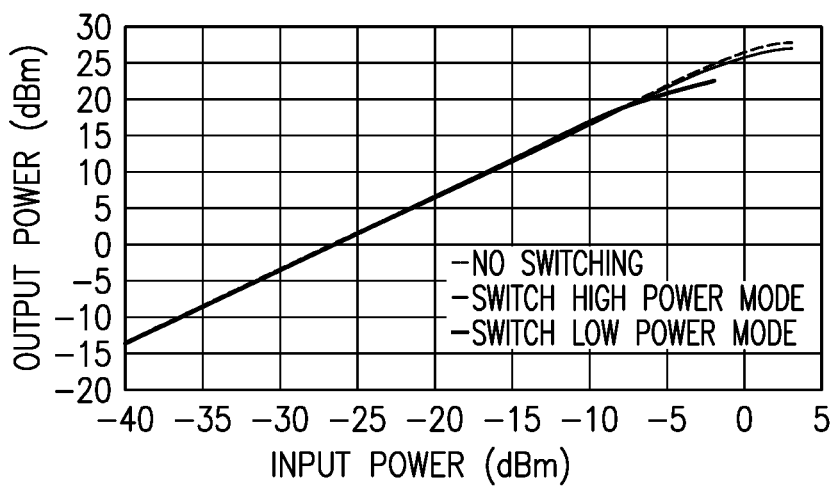
FIG. 7C is a graph showing possible input/output power characteristics of a power amplifier circuit implementing switchable output matching in accordance with one or more embodiments.

FIG. 7C is a graph showing possible input/output power characteristics of a power amplifier circuit implementing switchable output matching in accordance with one or more embodiments disclosed herein. The graph of FIG. 7C includes a curve representing potential performance characteristics for a power amplifier not implementing load line switching as disclosed herein for comparison purposes. In a high-power mode, the 1 dB compression point for the circuit may be approximately 26.5 dBm, while in a low-power mode the 1 dB compression point may be approximately 21.5 dBm.

Figure 7D:
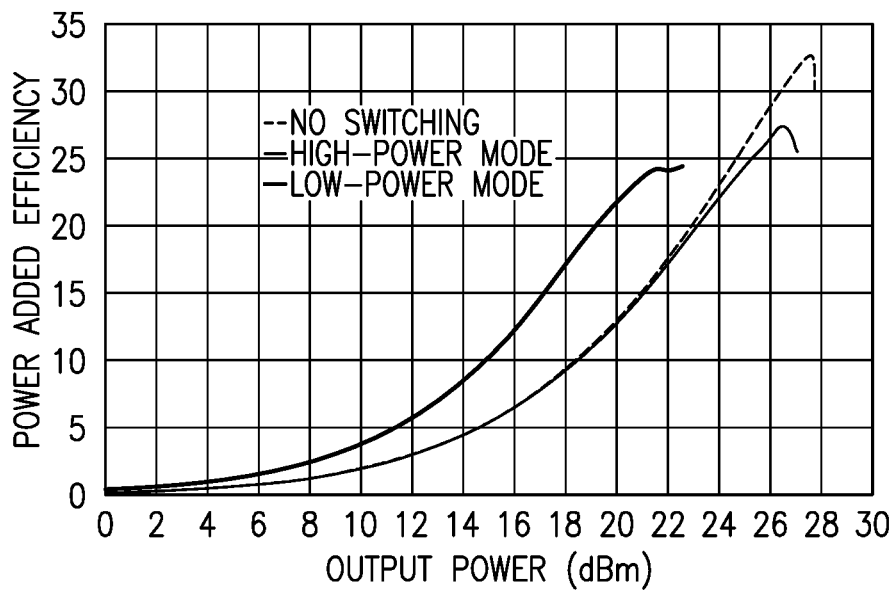
FIG. 7D is a graph showing possible power added efficiency (PAE) for low-power and high-power modes for a power amplifier circuit implementing switchable output matching in accordance with one or more embodiments.

FIG. 7D represents power added efficiency (PAE) for low-power and high-power modes for a power amplifier circuit implementing switchable output matching in accordance with one or more embodiments disclosed herein. FIG. 7D includes a curve representing potential PAE characteristics for a power amplifier not implementing output match switching for comparison purposes. As illustrated in the graph, while the low-power mode may not reach the same peak PAE value as the high-power mode, the low-power mode may provide relatively improved PAE at backed-off power levels.

Figure 7E:
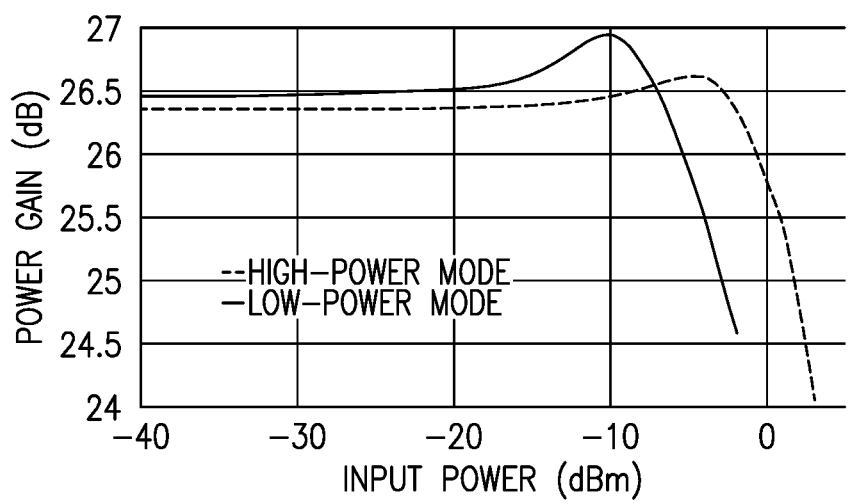
FIG. 7E is a graph showing possible gain versus input power in a power amplifier circuit implementing switchable output matching in accordance with one or more embodiments.
Figure 7F:
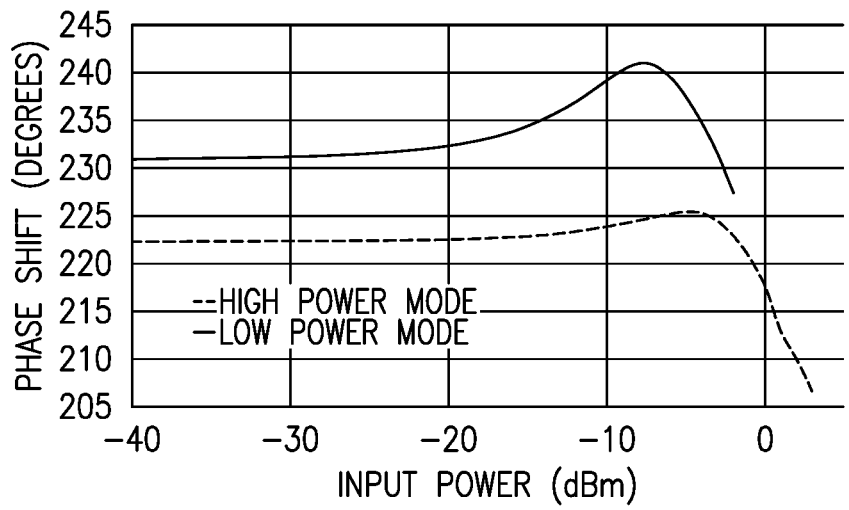
FIG. 7F is a graph showing possible phase shift versus input power in a power amplifier circuit implementing switchable output matching in accordance with one or more embodiments.

FIG. 7E is a graph showing possible gain versus input power in a power amplifier circuit implementing switchable output matching in accordance with one or more embodiments disclosed herein. FIG. 7F is a graph showing possible phase shift versus input power in a power amplifier circuit implementing switchable output matching in accordance with one or more embodiments disclosed herein. With respect to a power amplifier circuit similar to the circuit 530 shown in FIG. 5 and described above, the shape of the gain curve may be at least partially tunable by setting the value of $R_{BB}$, while the shape of the phase shift curve may be at least partially tunable by setting the value of the capacitor C4.

Figure 7G:
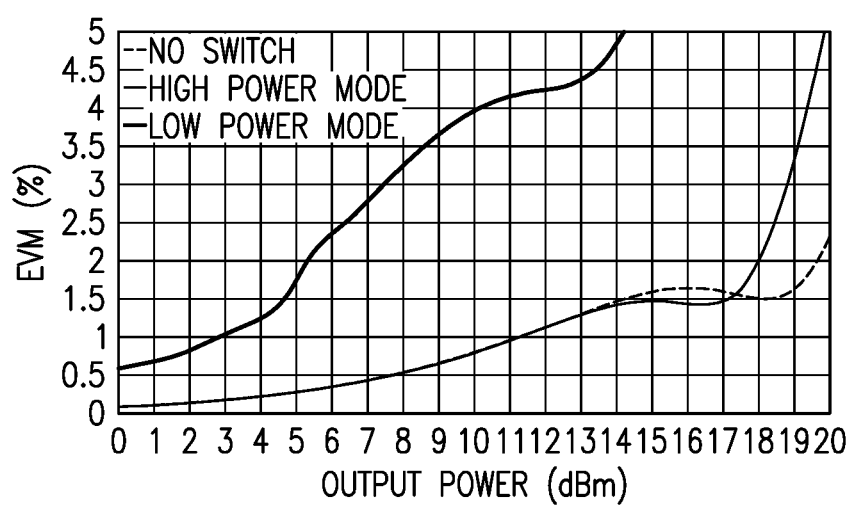
FIG. 7G is a graph showing possible error vector magnitude (EVM) in a power amplifier circuit implementing switchable output matching in accordance with one or more embodiments.

FIG. 7G is a graph showing possible error vector magnitude (EVM) in a power amplifier circuit implementing switchable output matching in accordance with one or more embodiments disclosed herein. FIG. 7G includes a curve showing potential EVM characteristics for a power amplifier not implementing switchable output matching for comparison purposes. As shown, in some implementations, a power amplifier not including switchable output matching may provide an EVM of approximately 1.6% at 19 dBm output power. Alternatively, in a high-power mode of a switched power amplifier may produce an EVM of approximately 3.2% at 19 dBm, whereas a low-power mode may result in a performance that is at least slightly worse due to increased variable phase shift in the design. At 13 dBm (e.g., 6 dB backed-off from high power mode), the EVM may be approximately 4.3%.

Module/Die Implementation

Figure 8:
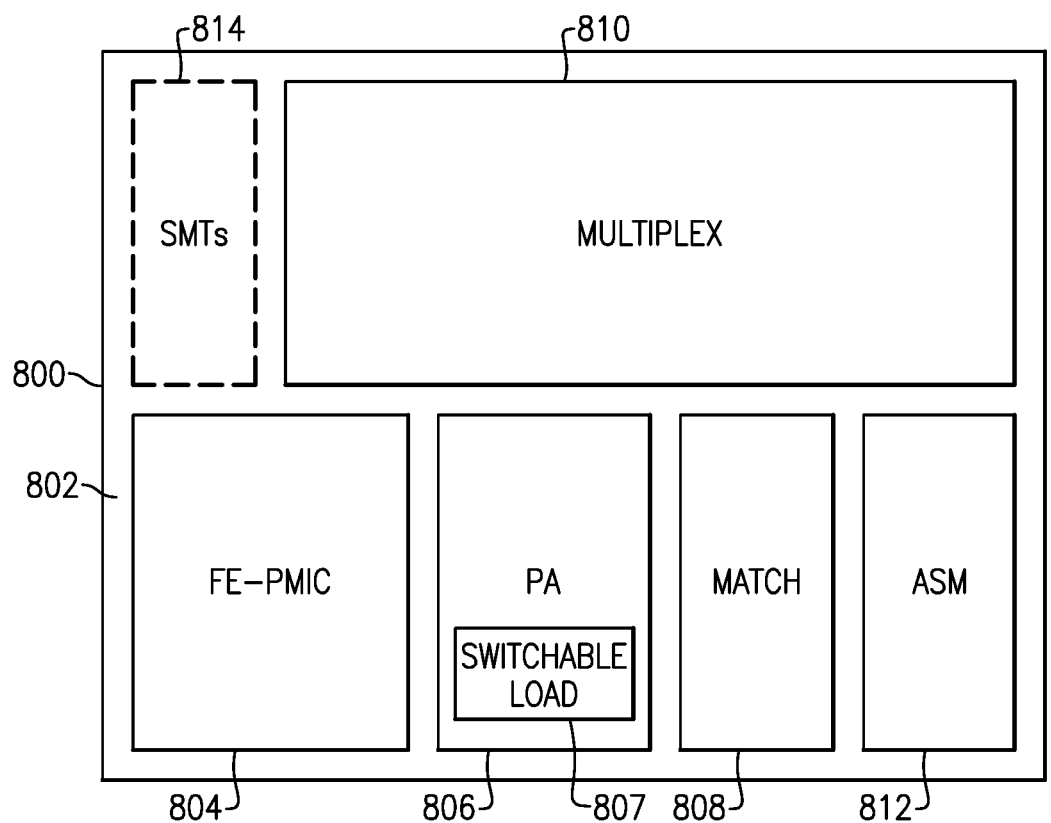
FIG. 8 is a block diagram of a radio-frequency module in accordance with one or more embodiments.

FIG. 8 shows that in some embodiments, some or all of power amplification configurations (e.g., those shown in FIGS. 3-4) can be implemented, wholly or partially, in a module. Such a module can be, for example, a front-end module (FEM). In the example of FIG. 8, a module 800 can include a packaging substrate 802, and a number of components can be mounted on such a packaging substrate. For example, a power management module 804, a power amplifier module 806, an impedance matching module 808 (which can include switchable matching impedance as disclosed herein), and a multiplexer assembly 810 can be mounted and/or implemented on and/or within the packaging substrate 802. Other components such as a number of SMT devices 814 and an antenna switch module (ASM) 812 can also be mounted on the packaging substrate 802. Although all of the various components are depicted as being laid out on the packaging substrate 802, it will be understood that some component(s) can be implemented over other component(s).

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 9:
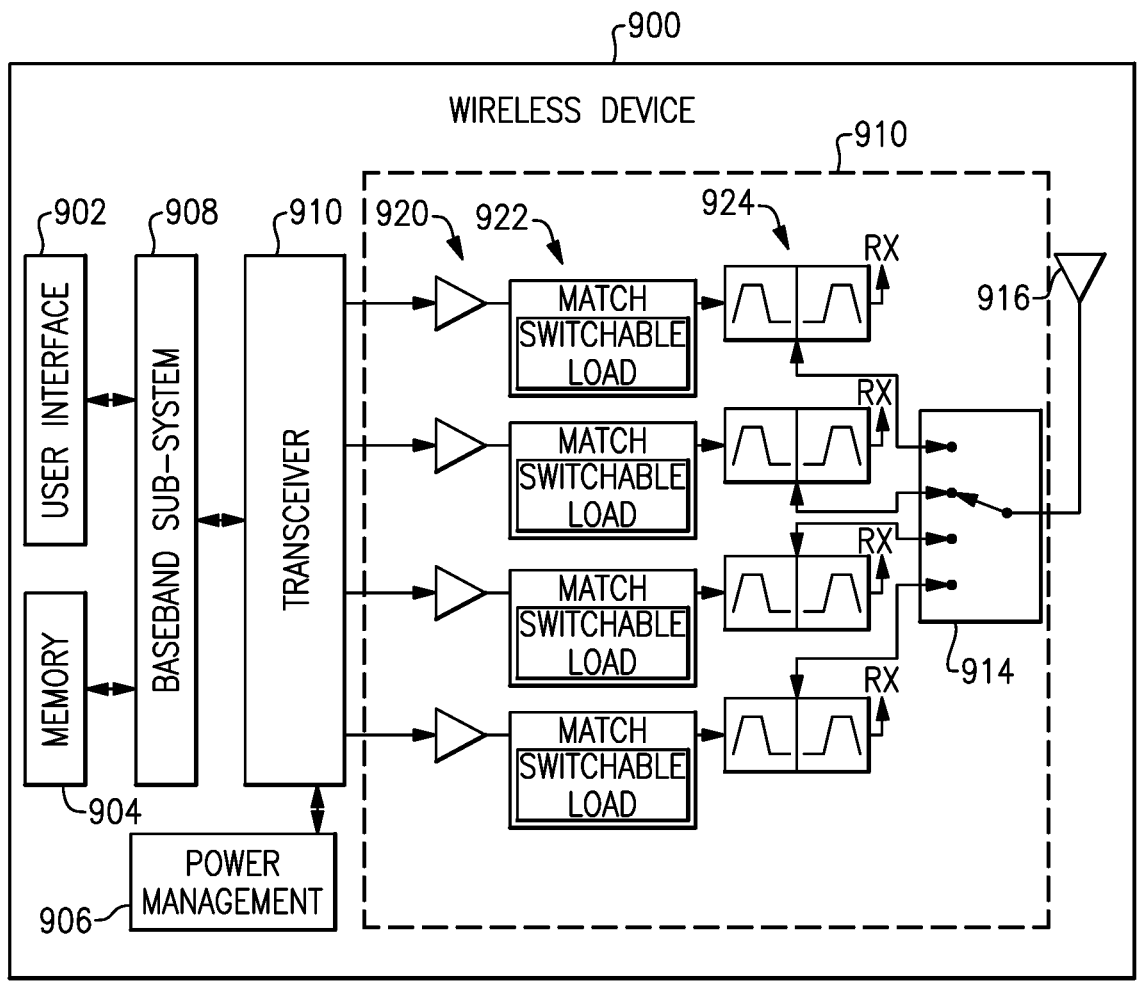
FIG. 9 is a block diagram of a wireless device according to one or more embodiments.

FIG. 9 schematically depicts an example wireless device 900 having one or more advantageous features described herein. The wireless device 900 may comprise one or more power amplifiers (PAs) 920 that may receive respective RF signals from a transceiver 910 that can be configured and operated in known manners to generate RF signals to be amplified and transmitted, and to process received signals. The transceiver 910 is shown to interact with a baseband sub-system 908 that is configured to provide conversion between data and/or voice signals suitable for a user and RF signals suitable for the transceiver 910. The transceiver 910 can also be in communication with a power management component 906 that is configured to manage power for the operation of the wireless device 900. Such power management can also control operations of the baseband sub-system 908 and the module 901.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In the example wireless device 900, outputs of the PAs 920 are shown to be matched via respective match circuits 922, which may have switchable matching load circuitry associated therewith, and further routed to their respective diplexers 924. Such amplified and filtered signals can be routed to an antenna 916 (or multiple antennas) through an antenna switch 914 for transmission. In some embodiments, the diplexers 924 can allow transmit and receive operations to be performed simultaneously using a common antenna (e.g., antenna 916). In FIG. 9, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency module comprising:
a power amplifier including a driver transistor coupled at a base thereof to a radio-frequency signal input path and a cascode transistor coupled at a collector thereof to a radio-frequency output signal path, an emitter of the cascode transistor being coupled to a base of the cascode transistor by a coupling path including a first capacitor;
an output matching network disposed in the radio-frequency output signal path, the output matching network including a first inductor and a shunt arm coupled to ground, the shunt arm including a second capacitor connected in series with a dynamically-switchable switch that is controllable to modify an operational impedance of the output matching network;
an inductive load coupled to the collector of the cascode transistor in parallel with the radio-frequency output signal path;
a bias circuit coupled to a radio-frequency input signal path of the power amplifier, the bias circuit including a current mirror having an output having a switchable resistance configured to selectively adjust how a voltage level on the radio-frequency signal input path increases a current through the power amplifier, the switchable resistance being coupled in parallel with the radio-frequency signal input path; and
an inter-stage matching circuit disposed in the radio-frequency input signal path, the inter-stage matching circuit including a second shunt arm connected between third and fourth capacitors, the second shunt arm including a second inductor coupled to ground.

2. The radio-frequency module of claim 1 wherein the output matching network is configured to present a first impedance when the switch is set in an OFF state for a high-power mode and present a second impedance when the switch is set in an ON state for a low-power mode, the second impedance being greater than the first impedance.

3. The radio-frequency module of claim 1 wherein the driver transistor is a first bipolar transistor and the cascode transistor is a second bipolar transistor, the driver transistor having a collector that is coupled to the emitter of the cascode transistor in a cascode configuration.

4. The radio-frequency module of claim 1 wherein the bias circuit includes a field-effect transistor disposed in an output path of the current mirror, the field-effect transistor including a gate terminal coupled to a switch control node and drain and source terminals coupled together via a first resistor of the switchable resistance.

5. The radio-frequency module of claim 4 wherein the first resistor is coupled in series with a second resistor of the switchable resistance disposed in the output path of the current mirror when the field-effect transistor is in an ON configuration.

6. The radio-frequency module of claim 1 wherein the first capacitor is an AM-PM distortion correcting capacitor.

7. A power amplifier circuit comprising:
a cascode transistor having an output at a collector thereof, the cascode transistor further including an emitter and base coupled together by a coupling path including a first capacitor;
a driver transistor coupled to the cascode transistor in a cascode configuration, the driver transistor having an input;
a radio-frequency output signal path coupled to the output of the cascode transistor at a first end and to a radio-frequency output port at a second end, the radio-frequency output signal path including a first series inductor;
a shunt output matching arm disposed in the radio-frequency output signal path, the shunt output matching arm including a second capacitor connected in series with a dynamically-switchable switch that is controllable to modify an operational impedance of the radio-frequency output signal path, the switch being configurable to selectively create an open circuit between the radio-frequency output signal path and a ground reference node;

bias circuitry coupled to the input of the driver transistor at an input node, the bias circuitry including a current source coupled to a base of a bias transistor, the bias transistor including a terminal coupled to an output current path that is coupled in parallel with the input of the driver transistor, the output current path including a switchable resistance configured to selectively adjust how a voltage level on the input of the driver transistor increases a current through the driver transistor, the switchable resistance being coupled in parallel with the input of the driver transistor; and inter-stage matching circuitry coupled to the input node and including a shunt inter-stage matching arm connected between third and fourth capacitors, the shunt inter-stage matching arm including a second inductor coupled to ground.

8. The power amplifier circuit of claim 7 wherein the shunt output matching arm is configured to present a first impedance when the switch is set in an OFF state for a high-power mode and present a second impedance when the switch is set in an ON state for a low-power mode, the second impedance being greater than the first impedance.

9. The power amplifier circuit of claim 7 wherein the second capacitor is configured to block any and all direct-current signals from passing to ground through the shunt output matching arm.

10. The power amplifier circuit of claim 7 wherein the switchable resistance includes a first resistor, a second resistor, and a field-effect transistor coupled to first and second ends of the first resistor at a drain and a source, respectively.

11. A wireless device comprising:

an antenna;

a transceiver configured to generate a radio-frequency input signal;

a radio-frequency module configured to receive the radio-frequency input signal and provide a radio-frequency output signal to the antenna;

power amplifier circuitry associated with the radio-frequency module and configured to generate an amplified signal based at least in part on the radio-frequency input signal using an amplifying transistor and provide the amplified signal on an output terminal of the amplifying transistor, the radio-frequency output signal being based at least in part on the amplified signal;

power amplifier output matching circuitry coupled to the output terminal of the amplifying transistor, the power amplifier output matching circuitry including a first inductor and a first shunt arm coupled to ground, the first shunt arm including a first capacitor connected in series with a switch that is controllable to modify an operational impedance of the power amplifier output matching circuitry;

driver bias circuitry coupled to a radio-frequency input of the power amplifier circuitry, the driver bias circuitry including a current mirror having an output having a switchable resistance configured to selectively adjust how radio-frequency input signal increases a current through the amplifying transistor, the switchable resistance being coupled in parallel with the radio-frequency input and configured to modify an output resistance of the current mirror; and inter-stage matching circuitry coupled to the radio-frequency input and including a second shunt arm connected between second and third capacitors, the second shunt arm including a second inductor coupled to ground.

12. The wireless device of claim 11 wherein the power amplifier output matching circuitry is configured to present a first impedance to the output terminal of the amplifying transistor when the switch is set in an OFF state for a high-power mode and present a second impedance to the output of the amplifying transistor when the switch is set in an ON state for a low-power mode, the second impedance being greater than the first impedance.

13. The wireless device of claim 11 wherein the output of the amplifying transistor is a collector of the amplifying transistor, the amplifying transistor including an emitter and base coupled together by a coupling path including a fourth capacitor.

* * * * *